(12) United States Patent
Kim et al.

(10) Patent No.: US 9,209,133 B2
(45) Date of Patent: Dec. 8, 2015

(54) SEMICONDUCTOR APPARATUS

(71) Applicant: SK hynix Inc., Icheon-si Gyeonggi-do (KR)

(72) Inventors: Jae Min Kim, Icheon-si (KR); Myung Gun Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 205 days.

(21) Appl. No.: 13/803,200

(22) Filed: Mar. 14, 2013

(65) Prior Publication Data

US 2014/0151842 A1    Jun. 5, 2014

(30) Foreign Application Priority Data

Dec. 3, 2012   (KR) ................. 10-2012-0138754

(51) Int. Cl.
  *H01L 23/52*  (2006.01)
  *H01L 23/525*  (2006.01)
  *H01L 23/00*  (2006.01)

(52) U.S. Cl.
  CPC .......... *H01L 23/5256* (2013.01); *H01L 23/564* (2013.01); *H01L 2224/16225* (2013.01); *H01L 2224/32225* (2013.01); *H01L 2224/4824* (2013.01); *H01L 2224/48091* (2013.01); *H01L 2224/73204* (2013.01); *H01L 2224/73215* (2013.01); *H01L 2924/15311* (2013.01)

(58) Field of Classification Search
  CPC ...... H01L 23/5256; H01L 23/60; H01L 23/62
  USPC .......................... 257/529, E23.149; 438/601
  See application file for complete search history.

(56) References Cited

U.S. PATENT DOCUMENTS 7,588,835 B2    9/2009 Yamashita et al.

*Primary Examiner* — Kenneth Parker
*Assistant Examiner* — John Lin
(74) *Attorney, Agent, or Firm* — William Park & Associates Ltd.

(57) ABSTRACT

A semiconductor apparatus includes a semiconductor chip formed with cut fuses over one surface thereof; and migration preventing modules preventing occurrence of a phenomenon in which metal ions of the fuses migrate to cut zones of the fuses; each migration preventing module including: a ground electrode formed in the semiconductor chip to face the fuse with a first insulation member interposed therebetween; a floating electrode formed over the fuse with a second insulation member interposed therebetween to face the ground electrode with the fuse interposed therebetween; and a power supply electrode formed over the floating electrode with a third insulation member interposed therebetween.

17 Claims, 6 Drawing Sheets

SEMICONDUCTOR APPARATUS

CROSS-REFERENCE TO RELATED APPLICATION

The present application claims priority under U.S.C 119(a) to Korean Patent Application Number 10-2012-0138754 filed in the Korean Intellectual Property Office on Dec. 3, 2012, which is incorporated herein by reference in its entirety.

BACKGROUND

1. Field of Invention

The present invention generally relates to a semiconductor apparatus, and more particularly, to a semiconductor apparatus having fuses.

2. Description of the Related Art

A semiconductor apparatus undergoes procedures such as THB (temperature humidity bias) and HAST (high acceleration stress test) to measure a reliability of the semiconductor apparatus. In such procedures, a fail is likely to occur in that a fuse of the semiconductor apparatus is changed from a cut state into an uncut state, and thus, a problem is caused in that the reliability of the semiconductor apparatus deteriorates.

In detail, TBH and HAST are procedures for a testing reliability under high temperature and high humidity conditions. As a cut fuse is exposed under the high temperature and high humidity conditions of TBH and HAST, the metal constituting the anode electrode of the cut fuse may be ionized, and the ionized metal may migrate toward the cathode electrode of the fuse. Due to migration of the ions, the anode electrode of the fuse is electrically connected to the cathode electrode of the fuse, thus, the cut fuses are likely to be short-circuited. That is to say, as a fail occurs in that the cut fuse is changed into an uncut state, the reliability of the semiconductor apparatus may deteriorate.

SUMMARY

Various embodiments are directed to a semiconductor apparatus capable of improving reliability.

In an embodiment, a semiconductor apparatus includes: a semiconductor chip formed with cut fuses over one surface thereof; and migration preventing modules preventing occurrence of a phenomenon in which metal ions of the fuses migrate to cut zones of the fuses; each migration preventing module including: a ground electrode formed in the semiconductor chip to face the fuse with a first insulation member interposed therebetween; a floating electrode formed over the fuse with a second insulation member interposed therebetween to face the ground electrode with the fuse interposed therebetween; and a power supply electrode formed over the floating electrode with a third insulation member interposed therebetween.

The semiconductor chip may include a substrate which is formed with semiconductor devices, and a circuit pattern layer which is formed over the substrate and has the one surface of the semiconductor chip as its upper surface, and the circuit pattern layer may include bonding pads formed over the one surface of the semiconductor chip; wiring layers electrically connecting the semiconductor devices with the bonding pads, and the semiconductor devices with the fuses; and an insulation layer insulating and isolating the semiconductor devices from the wiring layers, the wiring layers from one another, the wiring layers from the bonding pads, and the wiring layers from the fuses.

The ground electrode may be formed in the circuit pattern layer, and the first insulation member may be constituted by the insulation layer of the circuit pattern layer.

The third insulation member is constituted by a core of a printed circuit board having a first surface which faces the one surface of the semiconductor chip and a second surface which faces away from the first surface and formed of an insulation substance, and the printed circuit board having connection pads which are electrically connected with the bonding pads, respectively, of the semiconductor chip, and the floating electrode and the power supply electrode may be formed over the printed circuit board.

The connection pads may be formed over the first surface of the core. Meanwhile, the core may further have an opening which passes through the first surface and the second surface and exposes the bonding pads of the semiconductor chip, and the connection pads may be formed over the second surface of the core adjacent to edges of the opening.

The floating electrode may be formed over the first surface of the core, and the power supply electrode may be formed over the second surface of the core. The printed circuit board may further include external electrodes formed over the second surface of the core; and connection lines formed over the second surface of the core and electrically connecting external electrodes for a power supply voltage among the external electrodes with power supply electrodes.

The power supply electrode may be formed in the core. The printed circuit board may further include external electrodes formed over the second surface of the core; and connection lines formed in the core and electrically connecting external electrodes for a power supply voltage among the external electrodes with power supply electrodes.

The semiconductor apparatus may further include conductive connection members electrically connecting the bonding pads of the semiconductor chip with the connection pads of the printed circuit board. Each of the conductive connection members may include any one of a bump, a solder and a wire.

The second insulation member may be constituted by an underfill member, wherein the underfill member formed between the semiconductor chip and the printed circuit board. Meanwhile, the second insulation member may be constituted by an adhesive member, wherein the adhesive member formed between the semiconductor chip and the printed circuit board to attach the semiconductor chip and the printed circuit board to each other. Further, the semiconductor apparatus may further include a molding part formed over the first surface of the core including the semiconductor chip to mold the semiconductor chip.

The second insulation member may be constituted by a molding part, wherein the molding part filled between the semiconductor chip and the printed circuit board and formed over the first surface of the core including the semiconductor chip to mold the semiconductor chip.

The second insulation member is constituted by a first insulation layer, and the third insulation member is constituted by a second insulation layer, wherein the first insulation layer formed to insulate and isolate the fuses from floating electrodes, cover the one surface of the semiconductor chip including the fuses, and expose portions of the bonding pads, and the second insulation layer formed over the first insulation layer including the floating electrode to insulate and isolate the floating electrodes from the power supply electrodes.

The semiconductor apparatus may further include first redistribution lines formed over the first insulation layer and electrically connected with the portions of the bonding pads which are exposed through the first insulation layer, wherein the second insulation layer formed over the first insulation layer including the floating electrode and the first redistribution lines and expose portions of the respective first redistribution lines.

The semiconductor apparatus may further include second redistribution lines formed over the second insulation layer and electrically connected with the portions of the first redistribution lines which are exposed through the second insulation layer; and connection lines electrically connecting second redistribution lines for a power supply voltage among the second redistribution lines with the power supply electrodes. Besides, the semiconductor apparatus may further include a protective layer formed over the second insulation layer including the second redistribution lines and the connection lines to expose portions of the respective second redistribution lines, and external connection terminals mounted to the portions of the second redistribution lines which are exposed through the protective layer.

In an embodiment, a semiconductor apparatus includes: a cut fuse, wherein the cut fuse includes a anode electrode, a cathode electrode and a cutting portion between the anode electrode and the cathode electrode; and a field applying unit configured to generate an electric field toward the cutting portion.

DETAILED DESCRIPTION

Figure 1:
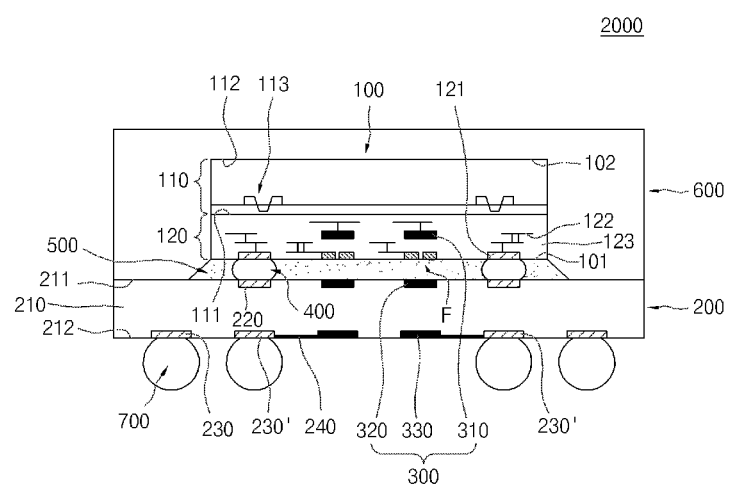
FIG. 1 is a cross-sectional view illustrating a semiconductor apparatus in accordance with an embodiment of the present invention.

Hereafter, various embodiments will be described in detail with reference to the accompanying drawings.

It is to be understood herein that the drawings are not necessarily to scale and in some instances proportions may have been exaggerated in order to more clearly depict certain features of the invention. Also, the same reference numerals or the same reference designators may denote the same elements throughout the specification.

Referring to FIG. 1, a semiconductor apparatus 2000 may include a semiconductor chip 100, a printed circuit board 200, and migration preventing modules 300. The semiconductor apparatus may further include conductive connection members 400, an underfill member 500, a molding part 600, and external connection terminals 700.

The semiconductor chip 100 may have one surface 101 on which fuses F are formed and the other surface 102 which faces away from the one surface 101. The semiconductor chip 100 may include a substrate 110 having the other surface 102 and a circuit pattern layer 120 having the one surface 101.

The substrate 110 has an active surface 111 and an inactive surface 112 which faces away from the active surface 111. The inactive surface 112 may correspond to the other surface 102 of the semiconductor chip 100. Semiconductor devices 113 are formed on the active surface 111 of the substrate 110. Each of the semiconductor devices 113 may include an image sensor, a memory semiconductor, a system semiconductor, a passive device, an active device, or a sensor semiconductor.

The circuit pattern layer 120 may be formed on the active surface 111 of the substrate 110. The one surface 101 of the semiconductor chip 100 may correspond to the upper surface of the circuit pattern layer 120. That is to say, the upper surface of the circuit pattern layer 120, which faces away from the lower surface of the circuit pattern layer 120 may constitute the one surface 101 of the semiconductor chip 100. The circuit pattern layer 120 may include bonding pads 121, a plurality of interconnection layers 122, and an insulation layer 123.

The bonding pads 121 are formed on the one surface 101 of the semiconductor chip 100. The bonding pads 121 are formed along edges of the one surface 101 of the semiconductor chip 100 when viewed from the top. In other words, the semiconductor chip 100 according to an embodiment may have an edge pad type structure. Further, the bonding pads 121 may be formed along the center portion of the one surface 101 of the semiconductor chip 100 when viewed from the top. In other words, the semiconductor chip 100 may have a center pad type structure.

The semiconductor devices 113 and the bonding pads 121 may be electrically connected by the plurality of the interconnection layers 122. The semiconductor devices 113 and the fuses F may be electrically connected by the plurality of the interconnection layers 122. The insulation layer 123 may insulate and isolate the semiconductor devices 113 from the interconnection layers 122, the interconnection layers 122 from one another, the interconnection layers 122 from the bonding pads 121, and the interconnection layers 122 from the fuses F.

While two fuses F are shown in FIG. 1, it is to be noted that a plurality of fuses F may be formed on the one surface 101 of the semiconductor chip 100 and may be disposed on a predetermined portion of the one surface 101 of the semiconductor chip 100 in such a way as to form an array.

Figure 2:
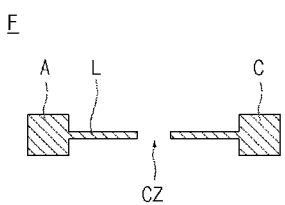
FIG. 2 is an enlarged view of the fuse of FIG. 1.

Referring to FIG. 2, each of the fuses F may include an anode electrode A, a cathode electrode C, and a fuse link L which is connected therebetween. The fuse link L is may selectively cut as the occasion demands before the semiconductor chip 100 is packaged after being manufactured. The reference symbol CZ of FIG. 2 designates the cut zone of the fuse F. Although not shown, in the case of an uncut fuse, the anode electrode A and the cathode electrode C may be electrically connected by the fuse link L.

Referring back to FIG. 1, the printed circuit board 200 may include a core 210, connection pads 220, external electrodes 230 and 230', circuit wiring lines (not shown), and connection lines 240.

The core 210 may have a first surface 211 which faces the one surface 101 of the semiconductor chip 100 and a second surface 212 which faces away from the first surface 211, and is constituted by an insulation substance. For example, the core 210 may be constituted by a glass fiber impregnated with epoxy. The connection pads 220 are formed on the first surface 211 of the core 210, and the external electrodes 230 and 230' are formed on the second surface 212 of the core 210. A power supply voltage from a external structural body (not drawn) such as a mother board is provided to the external electrodes 230'. The circuit wiring lines electrically connect the connection pads 220 and the external electrodes 230 and 230' through the core 210. While not shown, the circuit wiring lines may include a plurality of wiring layers and vias (via contact) which electrically connect wiring layers formed as different layers. The external connection terminals 700 such as solder balls may be mounted to the respective external electrodes 230 and 230'.

The bonding pads 121 of the semiconductor chip 100 and the connection pads 220 of the printed circuit board 200 may be connected by the conductive connection members 400. The conductive connection members 400 may include bumps or solder balls.

The underfill member 500 may be configured to fill a space between the semiconductor chip 100 and the printed circuit board 200. The joint strength between the semiconductor chip 100 and the printed circuit board 200 may be improved by the underfill member 500. Further, the one surface 101 of the semiconductor chip 100 may be insulated from printed circuit board 200 by the underfill member 500. The underfill member 500 may include thermosetting resin which is prepared by adding silica in an epoxy material. Meanwhile, in order to gapfill a narrow space, the underfill member 500 may be formed using thermosetting resin not added with silica.

The molding part 600 is formed over on the upper surface of the printed circuit board 200 including the semiconductor chip 100. The molding part 600 may include an epoxy molding compound (EMC).

Each of the migration preventing modules 300 may be configured to include a ground electrode 310, a floating electrode 320 and a power supply electrode 330. The migration preventing modules 300 may be provided for preventing the occurrence of a fail that the metal ions of the fuse F migrate to the cut zone CZ of the fuse F and the cut fuse F is changed into an uncut state. At this time, the fuse F may be a cut fuse.

The ground electrode 310 may be formed in the circuit pattern layer 120 of the semiconductor chip 100 to substantially face the fuse F. The insulation layer 123 may be interposed between the ground electrode 310 and the fuse F. While not shown, the ground electrode 310 may be electrically connected with a bonding pad (not shown) provided a ground voltage. For example, the ground electrode 310 and the bonding pad may be connected by the interconnection layer 122. Accordingly, the ground voltage provided from the bonding pad is applied to the ground electrodes 310 through the connection layer 122. The floating electrode 320 may be formed on the upper surface of the printed circuit board 200, that is the first surface 211 of the core 210. Since the underfill member 500 is interposed between the floating electrode 320 and the fuse F, the floating electrode 320 may be insulated and isolated from the fuse F. Further, the floating electrode 320 may be disposed to substantially face the ground electrode 310 with the fuse F interposed therebetween.

The power supply electrode 330 may be formed on the lower surface of the printed circuit board 200, that is, the second surface 212 of the core 210. The power supply electrode 330 may be insulated and isolated from the floating electrode 320 by the core 210 interposed therebetween.

The connection lines 240 may be formed on the second surface 212 of the core 210. The connection lines 240 may electrically connect the external electrodes 230' provided a power supply voltage with power supply electrodes 330. Accordingly, the power supply voltage provided from the external electrodes 230' is applied to the power supply electrodes 330 through the connection lines 240.

Figure 3:
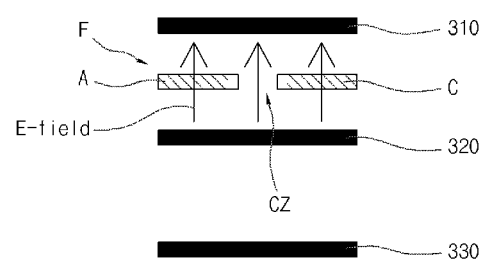
FIG. 3 is a view illustrating the function of the migration preventing module shown in FIG. 1.

Referring to FIG. 3, a coupling effect may be generated between the floating electrode 320 and the power supply electrode 330. Thus, the floating electrode 320 may have potential of the (+) level. Accordingly, a potential difference is induced between the floating electrode 320 of the (+) level and the ground electrode 310 of a ground level, and an E-field (Electrical field) is generated from the floating electrode 320 toward the ground electrode 310. This E-field may act in a direction perpendicular to a direction which extends from the anode electrode A to the cathode electrode C of the fuse F. Under the influence of the E-field, the metal ions of the anode electrode A of a cut fuse F are prevented from migrating toward the cathode electrode C of the cut fuse F. Namely, the migration of the metal ions of the cut fuse F is prevented. Thus, since it is possible to prevent the occurrence of a phenomenon in which the cut fuse F is changed into an uncut state due to the migration of the metal ions of the cut fuse F, the reliability of the semiconductor apparatus may be improved.

Figure 4:
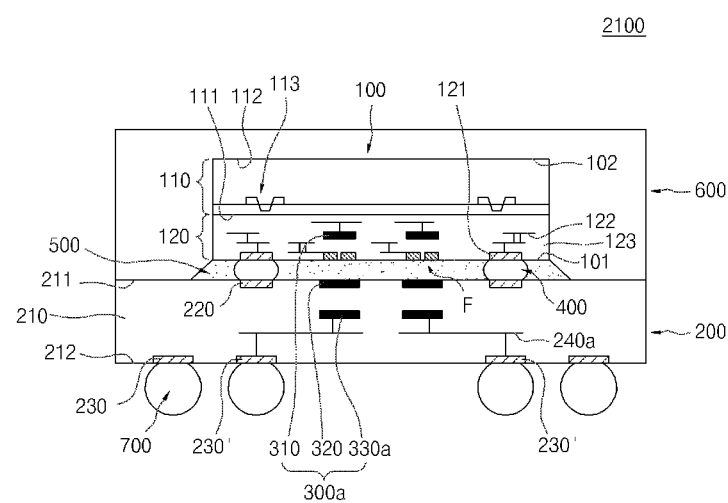
FIG. 4 is a cross-sectional view illustrating a semiconductor apparatus in accordance with an embodiment of the present invention.

Referring to FIG. 4, the semiconductor apparatus 2100 may have a construction that the position of the power supply electrode 330a and connection line 240a are changed in the semiconductor apparatus described above with reference to FIG. 1. Accordingly, the semiconductor apparatus 2100 may have substantially the same construction as the semiconductor apparatus 2000 of FIG. 1 except the power supply electrode 330a and connection line 240a. Therefore, repeated descriptions for the same component parts will be omitted herein, and the same terms and the same reference numerals will be used to refer to the same component parts.

Referring to FIG. 4, power supply electrodes 330a may be formed inside the core 210. A connection line 240a may be formed inside the core 210, and may electrically connected the power supply electrodes 330a with the external electrodes 230' provided a power supply voltage.

Since the spacing between each power supply electrode 330a and each floating electrode 320 may be decreased below the thickness of the core 210, the coupling ratio between the floating electrode 320 and the power supply electrode 330a may be improved. Since the potential of the floating electrode 320 may be proportional to the coupling ratio between the floating electrode 320 and the power supply electrode 330a, the potential of the floating electrode 320 with a desired level may be achieved using a lower level of a power supply voltage. That is to say, according to the present embodiment, because the level of a power supply voltage required to prevent the migration of the metal ions of a cut fuse may be decreased, power consumption may be reduced.

Figure 5:
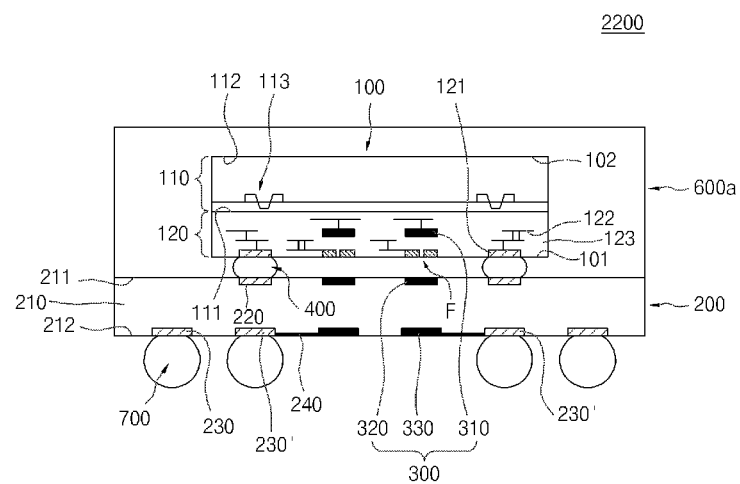
FIG. 5 is a cross-sectional view illustrating a semiconductor apparatus in accordance with an embodiment of the present invention.

Referring to FIG. 5, the semiconductor apparatus 2200 has a construction that the underfill member 500 may be omitted and the molding part 600a may be filled between the semiconductor chip 100 and the printed circuit board 200. Accordingly, the semiconductor apparatus 2200 may have substantially the same construction as the semiconductor apparatus 2000 of FIG. 1 except the underfill member 500 and the molding part 600a. Therefore, repeated descriptions for the same component parts will be omitted herein, and the same terms and the same reference numerals will be used to refer to the same component parts.

A molding part 600a may be configured to fill the space between the semiconductor chip 100 and the printed circuit board 200. Further, the molding part 600a may be formed on the upper surface of the printed circuit board 200 including the semiconductor chip 100 to mold the semiconductor chip 100, as the above described. The molding part 600a may include an epoxy molding compound (EMC).

Figure 6:
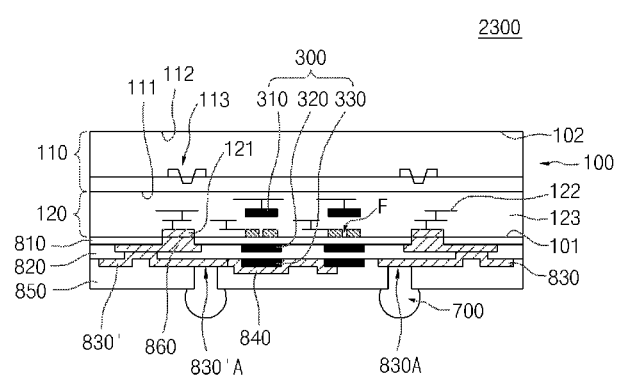
FIG. 6 is a cross-sectional view illustrating a semiconductor apparatus in accordance with an embodiment of the present invention.

Referring to FIG. 6, a semiconductor apparatus 2300 may include a semiconductor chip 100, and migration preventing modules 300. Besides, the semiconductor apparatus 2300 may include a first insulation layer 810, a second insulation layer 820, first redistribution lines 860, second redistribution lines 830 and 830', connection lines 840, a protective layer 850, and external connection terminals 700.

The semiconductor chip 100 may have substantially the same structure as the semiconductor chip 100 according to the above embodiment described with reference to FIGS. 1 and 2. Therefore, repeated description for the semiconductor chip 100 will be omitted herein, and the same terms and the same reference numerals will be used to refer to the same component parts.

The first insulation layer 810 may be formed on one surface 101 of the semiconductor chip 100 to cover fuses F and expose bonding pads 121.

The first redistribution lines 860 may be formed on the first insulation layer 810 to be electrically connected with the bonding pads 121, respectively, which are exposed through the first insulation layer 810.

Each of the migration preventing modules 300 may be include a ground electrode 310, a floating electrode 320 and a power supply electrode 330. The migration preventing modules 300 may be provided for preventing the occurrence of a fail that the metal ions of the fuse F migrate to a cut zone CZ of the fuse F and the cut fuse F is changed into an uncut state.

The ground electrode 310 may be formed in a circuit pattern layer 120 of the semiconductor chip 100 to substantially face the fuse F with an insulation layer 123 interposed therebetween. For example, the fuse F may be a cut fuse. While not shown, the ground electrode 310 may be electrically connected with a bonding pad (not shown) provided a ground voltage, through a interconnection layer 122, and accordingly, a ground voltage is applied to the ground electrode 310.

The floating electrode 320 may be formed on the first insulation layer 810, is insulated and isolated from the fuse F by the first insulation layer 810, and substantially face the ground electrode 310 with the fuse F interposed therebetween.

The second insulation layer 820 is formed on the first insulation layer 810 including the first redistribution lines 860 and floating electrodes 320, to be exposed portions of the respective first redistribution lines 860.

The power supply electrode 330 may be formed on the second insulation layer 820, substantially face the floating electrode 320 with the second insulation layer 820 interposed therebetween, and is insulated and isolated from the floating electrode 320 by the second insulation layer 820.

The second redistribution lines 830 and 830' may be formed on the second insulation layer 820 and be electrically connected with the portions, respectively, of the first redistribution lines 860 which are exposed through the second insulation layer 820. The connection lines 840 may be formed on the second insulation layer 820, and electrically connect the second redistribution lines 830' with power supply electrodes 330.

The protective layer 850 may be formed on the second insulation layer 820 including the power supply electrodes 330, the second redistribution lines 830 and 830' and the connection lines 840 to be exposed portions of the second redistribution lines 830 and 830'. The portions of the second redistribution lines 830 and 830' which are exposed through the protective layer 850 constitute electrodes 830A and 830'A for external connection. The external connection terminals 700 are mounted to the electrodes 830A and 830'A for external connection. A power supply voltage from a external structural body (not drawn) such as a mother board is provided to the second redistribution lines 830' through the external connection terminals 700. Accordingly, a power supply voltage from the external structural body is applied to the power supply electrodes 330 through the external connection terminals 700 and the second redistribution lines 830'.

Figure 7:
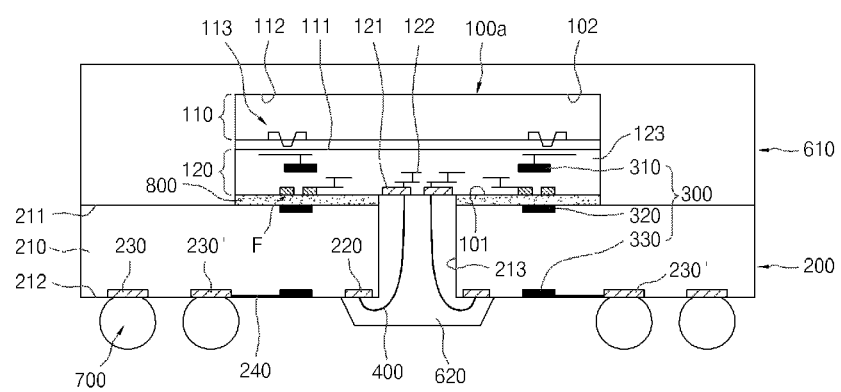
FIG. 7 is a cross-sectional view illustrating a semiconductor apparatus in accordance with an embodiment of the present invention.

Referring to FIG. 7, a semiconductor apparatus 2400 may include a semiconductor chip 100a, a printed circuit board 200, and migration preventing modules 300. Besides, the semiconductor apparatus may include conductive connection members 400, first and second molding parts 610 and 620, external connection terminals 700, and an adhesive member 800.

The semiconductor chip 100a may have a center pad type structure, unlike the semiconductor chip 100 of the semiconductor apparatus 2000, 2100, 2200 and 2300. In other words, bonding pads 121 of the semiconductor chip 100a may be formed along the center portion of one surface 101 of the semiconductor chip 100a. Accordingly, the semiconductor chip 100a may have substantially the same construction as the semiconductor chip 100 according to the above embodiment described with reference to FIG. 1 except the bonding pads 121. Therefore, repeated descriptions for the same component parts will be omitted herein, and the same terms and the same reference numerals will be used to refer to the same component parts.

The printed circuit board 200 may include a core 210, connection pads 220, external electrodes 230 and 230', and connection lines 240.

The core 210 may have a first surface 211 which faces the one surface 101 of the semiconductor chip 100a, a second surface 212 which faces away from the first surface 211, and an opening 213 which passes through the first surface 211 and the second surface 212 and exposes the bonding pads 121 of the semiconductor chip 100a. The core 210 may be formed of an insulation substance, for example, a glass fiber impregnated with epoxy.

The connection pads 220 may be formed on the second surface 212 of the core 210 adjacent to the edges of the opening 213. The external electrodes 230 and 230' may be formed on the second surface 212 of the core 210 apart from the connection pads 220. The external connection terminals 700 such as solder balls may be mounted to the respective external electrodes 230 and 230'. A power supply voltage from a external structural body (not drawn) such as a mother board is provided to the external electrodes 230' through the external connection terminals 700.

The conductive connection members 400 may electrically connect the bonding pads 121 of the semiconductor chip 100a and the connection pads 220 of the printed circuit board 200 through the opening 213. For example, the conductive connection members 400 are formed as wires.

The adhesive member 800 may be formed between the semiconductor chip 100a and the printed circuit board 200, and attach the semiconductor chip 100a and the printed circuit board 200 to each other.

The first molding part 610 may be formed on the upper surface of the printed circuit board 200 including the semiconductor chip 100a, that is, the first surface 211 of the core 210, and mold the semiconductor chip 100a. The second molding part 620 may be formed in and on the center portion of the second surface 212 of the core 210 including the opening 213, and mold the opening 213 including the conductive connection members 400. For example, each of the first and second molding parts 610 and 620 may include an epoxy molding compound (EMC).

Each of the migration preventing modules 300 may include a ground electrode 310, a floating electrode 320 and a power supply electrode 330. The migration preventing modules 300 may be provided for preventing the occurrence of a fail that the metal ions of the fuse F migrate to a cut zone CZ of the fuse F and the cut fuse F is changed into an uncut state. The ground electrode 310 may be formed in a circuit pattern layer 120 of the semiconductor chip 100a to substantially face the fuse F with an insulation layer 123 interposed therebetween. While not shown, the ground electrode 310 may be electrically connected with a bonding pad (not shown) provided a ground voltage through a interconnection layer 122, and accordingly, a ground voltage may be applied to the ground electrode 310.

The floating electrode 320 may be formed on the upper surface of the printed circuit board 200, that is the first surface 211 of the core 210, to be insulated and isolated from the fuse F with the adhesive member 800 interposed therebetween. The floating electrode may be disposed to face the ground electrode 310 with the fuse F interposed therebetween.

The power supply electrode 330 may be formed on the lower surface of the printed circuit board 200, that is, the second surface 212 of the core 210, and be insulated and isolated from the floating electrode 320 with the core 210 interposed therebetween.

The connection lines 240 may electrically connect the external electrodes 230' provided a power supply voltage with power supply electrodes 330. Accordingly, a power supply voltage from the external electrodes 230' may be applied to the power supply electrodes 330.

The semiconductor apparatus 2000, 2100, 2200, 2300 and 2400 described above may be applied to various electronic apparatuses.

Figure 8:
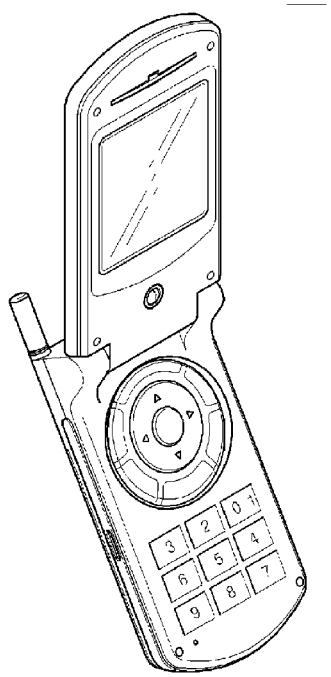
FIG. 8 is a perspective view illustrating an electronic apparatus having the semiconductor apparatus according to the embodiments of the present invention.

Referring to FIG. 8, the semiconductor apparatus 2000, 2100, 2200, 2300 and 2400 may be applied to an electronic apparatus 1000 such as a portable phone. Since the semiconductor apparatus 2000, 2100, 2200, 2300 and 2400 can prevent the occurrence of a fail, advantages are provided in improving the reliability of the electronic apparatus 1000. The electronic apparatus 1000 is not limited to the portable phone shown in FIG. 8, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 9:
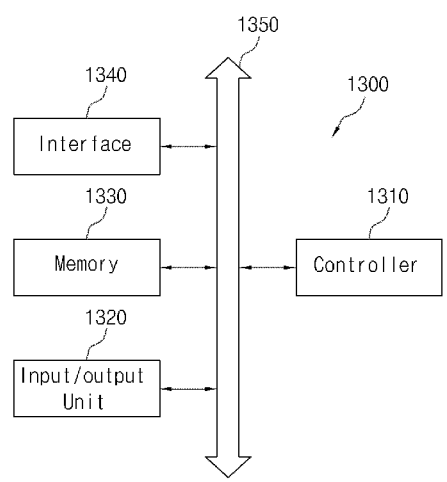
FIG. 9 is a block diagram showing an example of an electronic system having the semiconductor apparatus according to the embodiments of the present invention.

Referring to FIG. 9, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the semiconductor apparatus 2000, 2100, 2200, 2300 and 2400. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention may be applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

Although various embodiments have been described for illustrative purposes, those skilled in the art will appreciate that various modifications, additions and substitutions are possible, without departing from the scope and the spirit of the invention as disclosed in the accompanying claims.

What is claimed is:

1. A semiconductor apparatus comprising:
   a semiconductor chip formed with cut fuses;
   migration preventing modules formed to substantially face the cut fuses, respectively;
   each said migration preventing module comprising:
      a ground electrode formed in the semiconductor chip to substantially face the cut fuse with a first insulation member interposed therebetween;
      a floating electrode formed over the cut fuse with a second insulation member interposed therebetween to substantially face the ground electrode with the cut fuse interposed therebetween; and
      a power supply electrode formed over the floating electrode with a third insulation member interposed therebetween.

2. The semiconductor apparatus according to claim 1, wherein the semiconductor chip includes a substrate which is formed with semiconductor devices, and a circuit pattern layer which is formed over the substrate and has an upper surface comprising one surface of the semiconductor chip, and
   wherein the circuit pattern layer comprises:
      bonding pads formed over the one surface of the semiconductor chip;
      wiring layers electrically connecting the semiconductor devices with the bonding pads, and the semiconductor devices with the cut fuses; and
      an insulation layer insulating and isolating the semiconductor devices from the wiring layers, the wiring layers from one another, the wiring layers from the bonding pads, and the wiring layers from the cut fuses.

3. The semiconductor apparatus according to claim 2, wherein the ground electrode is formed in the circuit pattern layer, and the first insulation member is constituted by the insulation layer of the circuit pattern layer.

4. The semiconductor apparatus according to claim 2, wherein the third insulation member is constituted by a core of a printed circuit board having a first surface which faces the one surface of the semiconductor chip and a second surface which faces away from the first surface and formed of an insulation substance, the printed circuit board has connection pads which are electrically connected with the bonding pads, respectively, of the semiconductor chip, and the floating electrode and the power supply electrode are formed over the printed circuit board.

5. The semiconductor apparatus according to claim 4, wherein the connection pads are formed over the first surface of the core.

6. The semiconductor apparatus according to claim 4, wherein the core is formed to have an opening which passes through the first surface and the second surface and exposes the bonding pads of the semiconductor chip, and the connection pads are formed over the second surface of the core adjacent to edges of the opening.

7. The semiconductor apparatus according to claim 4, wherein the floating electrode is formed over the first surface of the core.

8. The semiconductor apparatus according to claim 4, wherein the power supply electrode is formed over the second surface of the core.

9. The semiconductor apparatus according to claim 8, wherein the printed circuit board further includes:
   external electrodes formed over the second surface of the core; and
   connection lines formed over the second surface of the core and electrically connecting external electrodes which provide a power supply voltage with power supply electrodes.

10. The semiconductor apparatus according to claim 4, wherein the power supply electrode is formed in the core.

11. The semiconductor apparatus according to claim 10, wherein the printed circuit board further includes:
   external electrodes formed over the second surface of the core; and
   connection lines formed in the core and electrically connecting external electrodes which provide a power supply voltage with power supply electrodes.

12. The semiconductor apparatus according to claim 4, wherein the second insulation member is constituted by an underfill member, and wherein the underfill member is formed between the semiconductor chip and the printed circuit board.

13. The semiconductor apparatus according to claim 4, wherein the second insulation member is constituted by an adhesive member, and wherein the adhesive member is configured to form between the semiconductor chip and the printed circuit board and attach the semiconductor chip and the printed circuit board to each other.

14. The semiconductor apparatus according to claim 4, wherein the second insulation member is constituted by a portion of a molding part, and wherein the molding part is filled between the semiconductor chip and the printed circuit board and formed over the first surface of the core including the semiconductor chip to mold the semiconductor chip.

15. The semiconductor apparatus according to claim 2, wherein the second insulation member is constituted by a first insulation layer, and the third insulation member is constituted by a second insulation layer,
   wherein the first insulation layer is formed to insulate and isolate the cut fuses from floating electrodes, cover the one surface of the semiconductor chip including the cut fuses, and expose portions of the bonding pads, and
   the second insulation layer is formed over the first insulation layer including the floating electrodes to insulate and isolate the floating electrodes from the power supply electrodes.

16. The semiconductor apparatus according to claim 15, further comprising:
   first redistribution lines formed over the first insulation layer and electrically connected with the portions of the bonding pads which are exposed through the first insulation layer,
   wherein the second insulation layer is formed over the first insulation layer including the floating electrodes and the first redistribution lines, and exposes portions of the respective first redistribution lines.

17. The semiconductor apparatus according to claim 16, further comprising:
   second redistribution lines formed over the second insulation layer and electrically connected with the portions of the first redistribution lines which are exposed through the second insulation layer; and
   connection lines electrically connecting second redistribution lines which provide a power supply voltage with the power supply electrodes.

\* \* \* \* \*